United States Patent [19]
Hall

[11] Patent Number: 5,350,711
[45] Date of Patent: Sep. 27, 1994

[54] METHOD OF FABRICATING HIGH TEMPERATURE REFRACTORY METAL NITRIDE CONTACT AND INTERCONNECT STRUCTURE

[76] Inventor: John H. Hall, 3169 Payne Ave., San Jose, Calif. 95117

[21] Appl. No.: 83,844

[22] Filed: Jun. 25, 1993

[51] Int. Cl.$^5$ .................. H01L 21/265; H01L 21/283
[52] U.S. Cl. ........................... 437/192; 437/20; 437/190; 437/195; 437/946
[58] Field of Search ............... 437/190, 192, 187, 20, 437/27, 195, 946; 257/753, 763

[56] References Cited

U.S. PATENT DOCUMENTS

| | | | |
|---|---|---|---|
| 4,265,935 | 5/1981 | Hall | 427/89 |
| 4,502,206 | 3/1985 | Schnable et al. | 437/187 |
| 4,680,854 | 7/1987 | Ho et al. | 437/15 |
| 4,835,112 | 5/1989 | Pfiester et al. | 437/24 |
| 4,960,732 | 10/1990 | Dixit et al. | 437/192 |
| 5,049,975 | 9/1991 | Ajika et al. | 257/764 |
| 5,173,449 | 12/1992 | Lorenzen et al. | 437/192 |
| 5,198,372 | 3/1993 | Verret et al. | 437/31 |
| 5,202,579 | 4/1993 | Fujii et al. | 257/763 |

FOREIGN PATENT DOCUMENTS 61-224435 10/1986 Japan .................. 437/192
62-200747 9/1987 Japan .................. 437/192

Primary Examiner—T. N. Quach
Attorney, Agent, or Firm—Townsend and Townsend Khourie and Crew

[57] ABSTRACT

An interconnect for an integrated circuit in a semiconductor substrate formed on an insulation layer on a surface of the substrate includes a first layer of a refractory metal nitride on said insulation layer, a layer of refractory metal on said first layer of refractory metal nitride, and a second layer of refractory metal nitride on said Layer of refractory metal, said first layer of refractory metal layer nitride, said layer of refractory metal, and said second layer of refractory metal nitride forming said interconnect structure. The interconnect structure makes contact with the integrated circuit through openings in the insulation layer. Boron ions are implanted into the substrate through the interconnect structure in the openings to facilitate ohmic contact between the substrate and the interconnect structure.

5 Claims, 1 Drawing Sheet

5,350,711

METHOD OF FABRICATING HIGH TEMPERATURE REFRACTORY METAL NITRIDE CONTACT AND INTERCONNECT STRUCTURE

BACKGROUND OF THE INVENTION

This invention relates generally to semiconductor device and integrated circuit fabrication, and more particularly the invention relates to high temperature contacts and interconnect structures in such devices and methods of making the same.

It is well known that a multilayer integrated circuit interconnection structure is desirable to improve circuit performance as well as to increase circuit density. Prior art structures include etched contact holes formed in an oxide coated wafer surface, a layer of aluminum formed on the oxide surface and in the contact holes to form contact with selected regions of the wafer. The aluminum layer is patterned to interconnect specific portions of the integrated circuit. This contact and interconnection structure has not been especially satisfactory for many applications because the highly reactive aluminum pits the silicon oxide during high temperature processing reducing the structure's breakdown voltage. Subsequent processing steps such as passivation and multilayer interconnection increases the reaction between the aluminum and the silicon oxide. Elevated temperature required for some processing steps, on the order of 900° C., further promote aluminum and oxide reaction. The aluminum may recrystallize in formation which crack the insulating layer separating multiple metal layers. Thus, the use of aluminum contacts and interconnections severely restricts subsequent processing steps at elevated temperatures.

U.S. Pat. No. 4,265,935 issued to John H. Hall, applicant herein, for HIGH TEMPERATURE REFRACTORY METAL CONTACT ASSEMBLY AND MULTIPLE LAYER INTERCONNECT STRUCTURE discloses a much improved multilayer structure which withstands high temperature processing much better than aluminum. The structure includes a layer of refractory metal such as molybdenum between two layers of silicon. The bottom silicon layer provides an adherent interface with an underlying insulating layer such as silicon oxide, while the top silicon layer is provided so that ohmic contact can be easily made to the refractory metal. While the multilayer structure is relatively inert and withstands subsequent high temperature processing, the structure can develop a high contact resistance after being exposed to higher temperatures. This is due to the fact that silicon in the contact holes is extracted and purified at high temperatures by reaction with the molybdenum to raise its resistance. There is also a problem with residual silicon dioxide on the surface of the silicon substrate in the contacting areas which causes erratic contact resistance.

The present invention is directed to an improved high temperature contact and interconnect structure which overcomes problems associated with prior art structures.

SUMMARY OF THE INVENTION

In accordance with the invention, a multilayer refractory metal and refractory metal nitride interconnect structure is provided. The refractory metal nitride structure is chemically inert while being electrically conductive and has the same work function as the refractory metal thereby facilitating high temperature processing for MOS devices. Reaction of the refractory metal layer with silicon is minimized by the nitride layers. The resulting structure can withstand processing temperatures in excess of 1000° C., which will be encountered in next generation semiconductor device fabrication.

In accordance with a feature of the invention, the multilayer structure can be fabricated in a vacuum sputtering operation in which a plasma gas atmosphere including nitrogen is introduced to obtain the nitride of the refractory metal, and an inert argon gas is introduced to deposit a pure refractory metal.

The invention and objects and features thereof will be more readily apparent from the following detailed description and appended claims when taken with the drawing.

DETAILED DESCRIPTION OF ILLUSTRATIVE EMBODIMENTS

Figure 1:
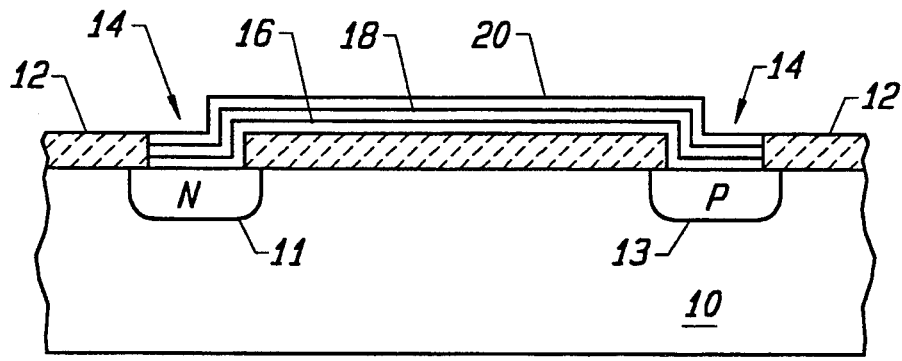
FIG. 1 is a section view of a contact and interconnect structure in accordance with the invention.

Referring now to the drawing, FIG. 1 is a section view of a contact and interconnect structure in accordance with the invention. The contact structure is provided over the surface of silicon substrate 10 in which an integrated circuit is fabricated. A surface of the substrate 10 is coated with an insulation layer 12 with contact openings 14 therethrough to expose N-doped and P-doped 11, 13 contact surfaces on the substrate 10.

The interconnect structure comprises a first layer 16 of a refractory metal nitride, tungsten nitride for example, a layer 18 of the tungsten refractory-metal overlying the first nitride layer 16, and a second layer 20 of the tungsten nitride overlying the surface of the refractory metal layer 18. It has been discovered that this multilayer contact structure can withstand fabrication temperatures beyond 1000° C., as will be encountered in the fabrication of future semiconductor products. The refractory metal nitride is very conductive and has the same work function as the refractory metal thereby facilitating high temperature metal oxide silicon (MOS) transistor processing.

Figure 2:
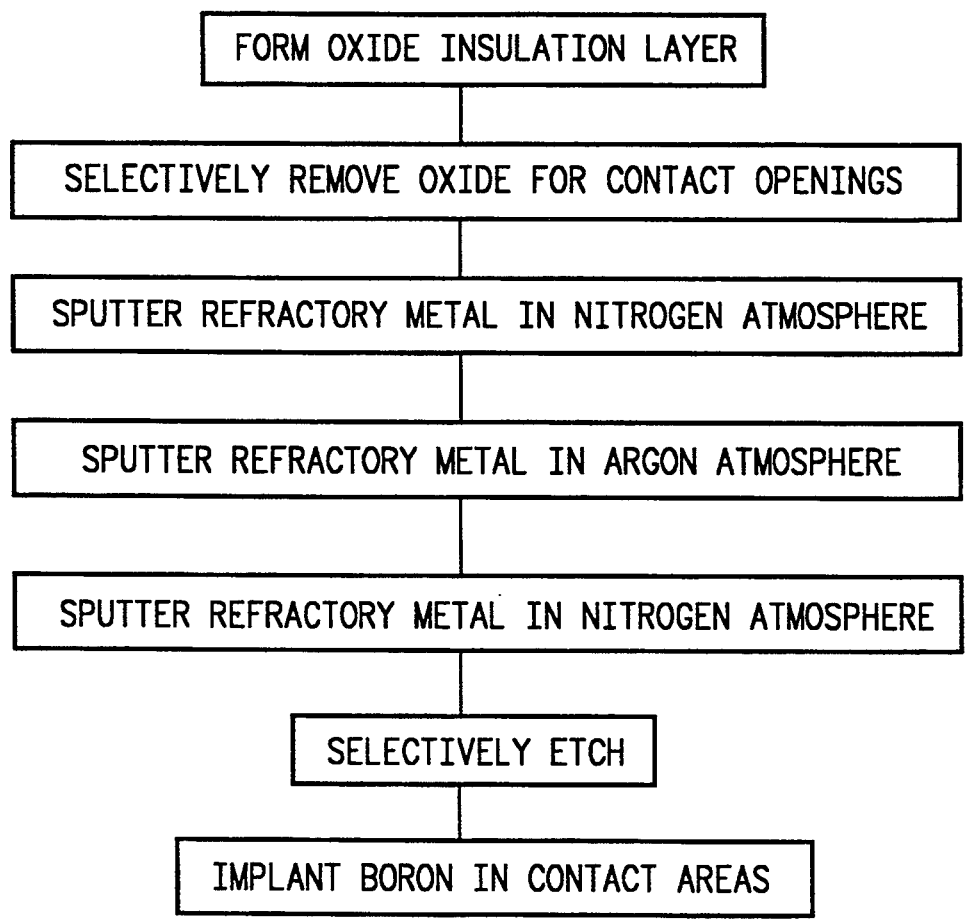
FIG. 2 is a flow diagram illustrating steps in fabricating the structure of FIG. 1.

FIG. 2 is a flow diagram illustrating a process in fabricating the interconnect structure of FIG. 1 in accordance with one embodiment. Initially, the insulation layer 12 in formed on the surface of silicon substrate 10 by the thermal oxidation of the surface in a steam atmosphere at 1000° C. The silicon oxide insulation layer is then selectively masked and etched to form the contact openings 14 therethrough to the previously diffused regions 11, 13.

The structure is then placed in a vacuum sputtering apparatus along with a target of tungsten. The first layer 16 of tungsten nitride is formed by sputtering the refractory metal in a plasma atmosphere including nitrogen. Thereafter, the nitrogen gas is purged from the atmosphere, and the refractory metal is sputtered in an inert argon plasma to form the layer 18 of pure refractory metal. Thereafter, nitrogen is again introduced into the atmosphere and the second layer 20 of tungsten nitride is deposited on the surface of the refractory metal, thereby completing the formation of the multilayer structure. The structure can then be selectively etched to define a desired interconnect pattern.

The ability of the silicon substrate to react with the refractory metal is limited by the nitride layer by limiting the diffusion of silicon into the refractory metal and limiting the contact resistance by keeping the thickness of the layer to approximately 200 Å.

A problem in the contact structure can arise from residual silicon oxide on the surface of the silicon substrate prior to formation of the multilayer contact. In accordance with the invention in my co-pending application No. 082,629 filed Jun. 25, 1993, after formation of the multilayer contact an implant of boron or similar ion of approximately 1E15 at 100 kilovolts is made through the contact into the underlying substrate drives the refractory metal through any residual oxide thus allowing a consistent ohmic contact to be formed. Boron is selected for this implant since it enhances contact to P-type material and does not interfere with the contact to high concentration N-type material, which is usually found in source, drain, or emitter diffusions.

While the illustrative embodiments are described with tungsten refractory metal, other refractory metals such as molybdenum, and tantalum, can be employed in practicing the invention. Further, while the described process employs sputter deposition, chemical vapor deposition can be used, also. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating an interconnect structure for a semiconductor integrated circuit comprising the steps of
   providing a semiconductor substrate having an insulation layer on a surface,
   selectively etching said insulation layer to form contact openings to said substrate,
   depositing a first layer of a nitride of a refractory metal on said insulation layer and in said contact openings,
   depositing a layer of said refractory metal on said first layer,
   depositing a second layer of a nitride of said refractory metal on said layer of refractory metal, said first layer, said layer of refractory metal, and said second layer forming said interconnect structure; and
   implanting boron ions in said substrate through said interconnect structure in said openings to facilitate ohmic contact between said interconnect structure and said substrate.

2. The method as defined by claim 1 and further including selectively etching said first layer, said layer of refractory metal, and said second layer to define an interconnect pattern.

3. The method as defined by claim 1 wherein said step of depositing a first layer of a nitride of a refractory metal includes bombarding a refractory metal target in a plasma gas including nitrogen, and said step of depositing a layer of said refractory metal includes bombarding said refractory metal in an inert plasma gas.

4. The method of as defined by claim 1 wherein said step of depositing a layer includes chemical vapor deposition.

5. The method as defined by claim 1 wherein said refractory metal is selected from the group consisting of molybdenum, tungsten, and tantalum.

* * * * *